United States Patent
Takeda

(10) Patent No.: US 9,932,992 B2
(45) Date of Patent: Apr. 3, 2018

(54) PIEZOELECTRIC FAN

(71) Applicant: R-flow Co., Ltd., Soka-shi, Saitama (JP)

(72) Inventor: Hiroshi Takeda, Soka (JP)

(73) Assignee: R-FLOW CO., LTD., Soka-shi, Saitama (JP)

( * ) Notice: Subject to any disclaimer, the term of this patent is extended or adjusted under 35 U.S.C. 154(b) by 0 days.

(21) Appl. No.: 15/102,756

(22) PCT Filed: Jul. 30, 2014

(86) PCT No.: PCT/JP2014/070034
§ 371 (c)(1),
(2) Date: Jun. 8, 2016

(87) PCT Pub. No.: WO2016/016963
PCT Pub. Date: Feb. 4, 2016

(65) Prior Publication Data
US 2016/0312802 A1    Oct. 27, 2016

(51) Int. Cl.
*F04D 33/00* (2006.01)
*F04D 25/08* (2006.01)
*H01L 41/09* (2006.01)

(52) U.S. Cl.
CPC ............ *F04D 33/00* (2013.01); *F04D 25/08* (2013.01); *H01L 41/094* (2013.01)

(58) Field of Classification Search
CPC ......... F04D 33/00; F04D 25/08; H04R 17/00; H01L 41/0926; H01L 41/0933;
(Continued)

(56) References Cited

U.S. PATENT DOCUMENTS 4,498,851 A * 2/1985 Kolm ................ F04D 33/00
                                                    310/331
4,780,062 A * 10/1988 Yamada ............ F04D 33/00
                                                    310/316.01
(Continued)

FOREIGN PATENT DOCUMENTS

JP    2002-364599 A    12/2002
JP    2006-037754 A    2/2006
(Continued)

OTHER PUBLICATIONS

Yoo et al. "Piezoelectric ceramic bimorph coupled to thin metal plate as cooling fan for electronic devices"; Jan. 2000, pp. 8-12.*
(Continued)

*Primary Examiner* — Devon Kramer
*Assistant Examiner* — Lilya Pekarskaya
(74) *Attorney, Agent, or Firm* — Bruzga & Associates; Charles E. Bruzga; Shlomo S. Moshen

(57) ABSTRACT

A piezoelectric fan is provided that can effectively supply airflow to a subject to be cooled. The piezoelectric fan includes an air blower having a free end and a fixed end, and a planar piezoelectric element fixed to the air blower. The piezoelectric element causes vibration of the free end of the air blower. The air blower includes a first plate to which the piezoelectric element is fixed, and a second plate and a third plate which are orthogonal to the first plate and parallel to each other. In this structure, the free end of the air blower is H-shaped. The H-shaped blowing end of the air blower effectively prevents lateral airflow and improves the directivity of airflow.

6 Claims, 14 Drawing Sheets

(58) Field of Classification Search
CPC .... H01L 41/094; F04B 17/003; F04B 43/046; F04B 43/095
See application file for complete search history.

(56) References Cited

U.S. PATENT DOCUMENTS

| | | | |
|---|---|---|---|
| 9,644,624 B2* | 5/2017 | Tanaka | F04B 43/046 |
| 2007/0090726 A1* | 4/2007 | Morris | F04D 29/023 |
| | | | 310/330 |
| 2011/0005733 A1* | 1/2011 | Wada | F04D 33/00 |
| | | | 165/121 |
| 2014/0017594 A1 | 6/2014 | Tanaka | |
| 2014/0219838 A1* | 8/2014 | Chiang | F04B 45/047 |
| | | | 417/410.2 |

FOREIGN PATENT DOCUMENTS

| | | | |
|---|---|---|---|
| JP | 2007-237963 A | | 9/2007 |
| JP | 2008-297915 A | | 12/2008 |
| JP | 2010-031708 A | | 2/2010 |
| JP | 2012-184665 A | | 9/2012 |
| JP | 2012184665 A | * | 9/2012 |
| JP | 3183915 U | | 6/2013 |
| JP | 5556968 B2 | | 7/2014 |
| WO | 2010/034899 A1 | | 4/2010 |

OTHER PUBLICATIONS

Translation of JP2012184665 A, Tanida "Piezoelectric fan", Sep. 2012.*

* cited by examiner

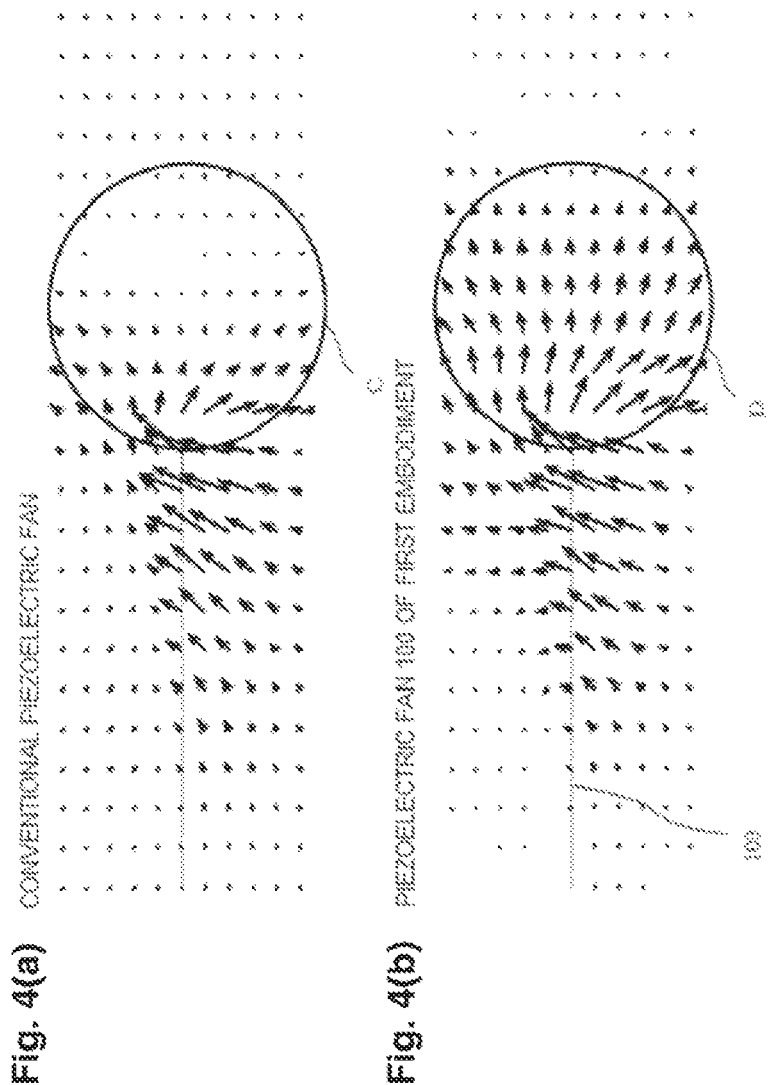

PIEZOELECTRIC FAN

FIELD OF THE INVENTION

The present invention relates to a piezoelectric fan, an ultra-thin fan that includes a piezoelectric element to drive a blowing blade.

BACKGROUND OF THE INVENTION

A piezoelectric fan is an ultra-thin fan that includes a piezoelectric element to cool local heat sources such as electronic devices. A piezoelectric fan is driven by an AC voltage applied to a piezoelectric element. The AC voltage causes a planar body to vibrate and generate airflow (see Japanese Patent Laying-Open No. 2012-184665, for example). The piezoelectric fan disclosed in Japanese Patent Laying-Open No. 2012-184665 is driven by a voltage fed from a drive AC power source and applied across electrodes (not shown) formed on a piezoelectric element and a vibration blade made of a conductive material. The expansion and contraction of the piezoelectric element by the applied voltage causes a free end of the vibration blade to bend and vibrate like a paper fan, whereby the piezoelectric element is driven as a fan. The piezoelectric fan disclosed in Japanese Patent Laying-Open No. 2012-184665 includes a plurality of vibration blades, each of which is placed between radiation fins of a heat sink.

SUMMARY OF THE INVENTION

Technical Problem

Unfortunately, the bending vibration of the planar vibration blade, which acts like a fan, cannot supply a sufficient rate of airflow in a desired direction. Moreover, a clearance is provided between the vibration blade and the radiation fin to prevent their contact; hence, air flows in various directions, for example in a lateral direction. This leads to the fact that the vibration blade cannot efficiently supply airflow to the radiation fins, resulting in a disadvantage of poor cooling efficiency of the heat sink. The cooling efficiency can be improved by minimizing the clearance between the vibration blade and the radiation fin. The minimization of the clearance, however, requires the adjustment of the size of the vibration blade to the interval between the radiation fins of the heat sink. A possible measure to improve the cooling efficiency is to increase the airflow rate. Using a larger piezoelectric element to achieve a higher airflow rate, however, causes higher manufacturing cost and higher energy consumption and accelerated deterioration of the vibration blade.

An object of the present invention, which has been made to solve these problems is to provide a novel and improved piezoelectric fan that can effectively supply airflow to a subject to be cooled and thus improve the cooling efficiency.

Solution to the Problem

To solve the above problems, the piezoelectric fan of the present invention includes an air blower having a free end and a fixed end, and a planar piezoelectric element fixed to the air blower. The piezoelectric element causes vibration of the free end of the air blower. The air blower includes a vibration plate to which the piezoelectric element is fixed, one side plate disposed on one longitudinal edge of the vibration plate, and/or another side plate disposed on the other longitudinal edge of the vibration plate. In an embodiment of such a structure, the free end of the air blower may be H-shaped. In addition, the vibration plate and one or both of the side plates may be integrated.

According to the present invention, the air blower includes the vibration plate to which the piezoelectric element is fixed, and the one side plate disposed on one longitudinal edge of the vibration plate, and/or the another side plate disposed on the other longitudinal edge of the vibration plate. In this structure, the side plate prevents the lateral airflow generated by the vibration plate, and thus improves the directivity of airflow. The piezoelectric fan of the present invention can effectively supply airflow to a subject to be cooled.

The piezoelectric fan of the present invention has many variations. For example, one or both of the ends of the side plates may extend beyond the end of the vibration plate at the free end. This structure further effectively prevents spread of airflow supplied from the tip of the piezoelectric fan, and thus improves the directivity of airflow and increases the volume and velocity of airflow.

The side plate may extend asymmetrically in the vertical direction from the longitudinal edge of the vibration plate. In particular, as an ultimate asymmetrical structure, the side plate may extend only upward or downward from the longitudinal edge of the vibration plate. In this structure, the volume and velocity of airflow supplied from the surface having longer extensions is greater than the volume and velocity of airflow supplied from the surface having shorter extensions. If other components are placed near the side plates, the side plates with shorter extensions can keep larger clearances from the components and avoid contact with the components during the bending vibration of the piezoelectric fan.

The vibration plate and the side plates may be composed of different parts. The vibration plate and the side plates may be made of different materials. In particular, having the vibration plate made of a material with a higher bending strength than that of the side plate and/or the side plate made of a material with a lower specific gravity than that of the vibration plate enhances the strength of the piezoelectric fan and prolongs its life.

The piezoelectric fan of the present invention may be a combination of two or more variations described above.

Advantageous Effects of the Invention

According to the present invention, the piezoelectric fan can prevent the lateral airflow and thus improve the directivity of airflow. The piezoelectric fan can effectively supply airflow to a subject to be cooled. Other advantageous effects of the present invention will be described in the following description of embodiments.

BRIEF DESCRIPTION OF THE DRAWINGS

Further features and advantages of the invention will become apparent from reading the following detailed description in conjunction with the following drawings, in which like reference numbers refer to like parts:

FIGS. 4(a) and 4(b) generally illustrate simulated volumes and directions of airflows generated by piezoelectric fans, viewed from the side. FIG. 4(a) illustrates the volume and direction of airflow generated by a conventional piezoelectric fan. FIG. 4(b) illustrates the volume and direction of airflow generated by the piezoelectric fan of the first embodiment.

FIG. 5(a) illustrates the volume and direction of airflow generated by a conventional piezoelectric fan. FIG. 5(b) illustrates the volume and direction of airflow generated by the piezoelectric fan of the first embodiment.

DETAILED DESCRIPTION OF THE INVENTION

The examples and the referenced drawings in this detailed description are merely exemplary, and should not be used to limit the scope of the claims in any claim construction or interpretation.

First Embodiment

Figure 1:
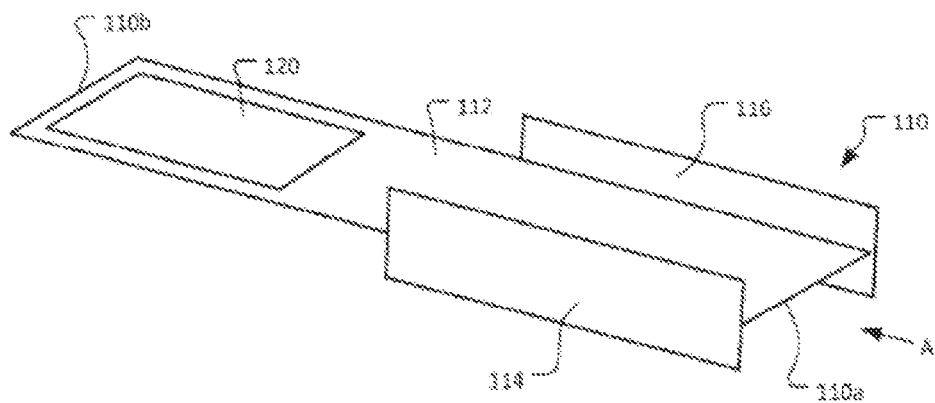
FIG. 1 is a schematic view of the piezoelectric fan according to the first embodiment.

The first embodiment of the present invention will now be described. FIG. 1 is a schematic view of a piezoelectric fan 100 according to the first embodiment.

As shown in FIG. 1, the piezoelectric fan 100 of the first embodiment includes an air blower 110 having a free end 110a and a fixed end 110b, and a planar piezoelectric element 120 fixed to the air blower 110. The piezoelectric element 120 causes vibration of the free end 110a of the air blower 110. The individual components are as described below in detail.

Air Blower 110 of the First Embodiment

Figure 2:
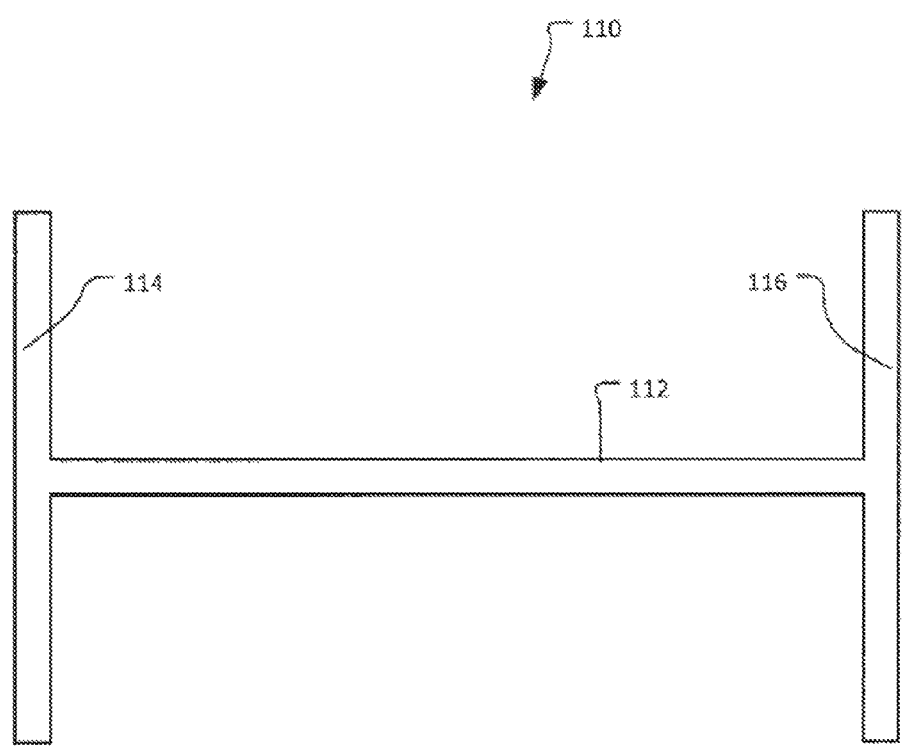
FIG. 2 is a side view from the direction of the arrow A, of the piezoelectric fan of FIG. 1.

The air blower 110 includes a first plate 112 to which the piezoelectric element 120 is fixed, and a second plate 114 and a third plate 116 which are orthogonal to the first plate 112 and parallel to each other. In this structure, the free end 110a of the air blower 110 is H-shaped. FIG. 2 is a side view of the piezoelectric fan 100 of FIG. 1, viewed from the side of the free end 110a (from the direction of the arrow A in FIG. 1).

One end of the air blower 110 is the free end 110a and the other end is the fixed end 110b. As shown in FIG. 1, the second plate 114 and the third plate 116 are disposed adjacent to the free end 110a of the air blower 110. The piezoelectric element 120 described below is disposed on the first plate 112 adjacent to the fixed end 110b. The fixed end 110b is fixed to a housing of an electronic device (not shown) on which the piezoelectric fan 100 is mounted, and functions as a node of vibrations.

As shown in FIG. 2, in the first embodiment, the first plate 112, the second plate 114, and the third plate 116 are integrated with the same material. The first plate 112, the second plate 114, and the third plate 116 of the air blower 110 are in the form of a thin plate. The first plate 112 is rectangular, and is 70 mm long, 12 mm wide, and 0.5 mm thick, for example. The second plate 114 and the third plate 116 have the same dimensions, for example, 35 mm long, 12 mm wide, and 0.5 mm thick. The first plate 112, the second plate 114, and the third plate 116 may be made of conductive materials such as a Ni—Fe alloy. It should be noted that the dimensions and materials of the air blower 110 described herein are merely illustrative, not limitative.

Piezoelectric Element 120 of the First Embodiment

A piezoelectric element is generally a passive element, which is based on the piezoelectric effect of converting force applied to the piezoelectric body to voltage or converting voltage applied to the body to force. A piezoelectric element may also be referred to as a piezo element. The piezoelectric element 120 of the first embodiment is planar, and is 25 mm long, 10 mm wide, and 0.13 mm thick, for example. An electrode is formed on one of its main surfaces. The piezoelectric element 120 may be composed of any material, such as a lead zirconate titanate (PZT) ceramic. It should be noted that the dimensions and materials of the piezoelectric element 120 described herein are merely illustrative, not limitative.

The foregoing discussion has described the structure of the piezoelectric fan 100 of the first embodiment. An electrical connection of the piezoelectric fan 100 will now be described with reference to FIG. 3.

Figure 3:
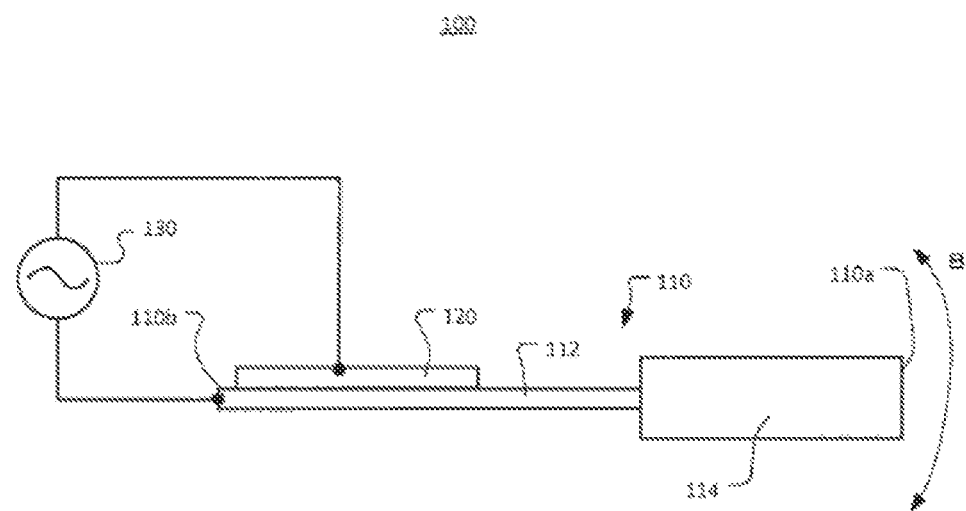
FIG. 3 is a schematic view illustrating an electrical connection of the piezoelectric fan of FIG. 1.

As shown in FIG. 3, in the piezoelectric fan 100, a voltage from an AC power source 130 is applied across the electrode (not shown) formed on the piezoelectric element 120 and the conductive air blower 110. When the voltage from the AC power source 130 is applied, ions located at random in the piezoelectric element 120 align so as to cause the deformation of the piezoelectric element 120. The deformation of the piezoelectric element 120 occurs at the same frequency as that of the AC power source 130. The piezoelectric element 120 longitudinally expands and contracts at the same frequency as that of the AC power source 130. The longitudinal expansion and contraction of the piezoelectric element 120 leads to bending vibration, like a fan, of the free end 110a of the air blower 110 in the thickness direction of the piezoelectric element 120 (in the direction of the arrow B in FIG. 3) since the other end (the fixed end 110b) is fixed. In this way, airflow is supplied from the free end 110a of the piezoelectric fan 100 to a heat sink described below or a subject to be cooled.

Simulations of the First Embodiment

Figure 5A:
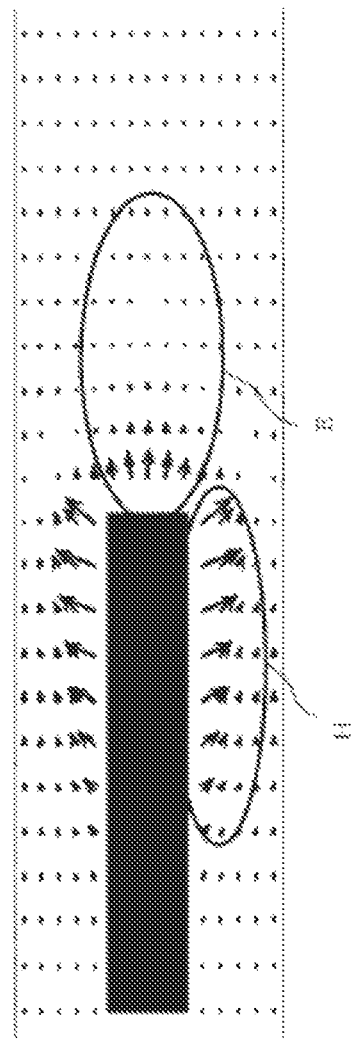
FIGS. 5(a) and 5(b) generally illustrate simulated volumes and directions of airflows generated by piezoelectric fans when viewed from the top.
Figure 5B:
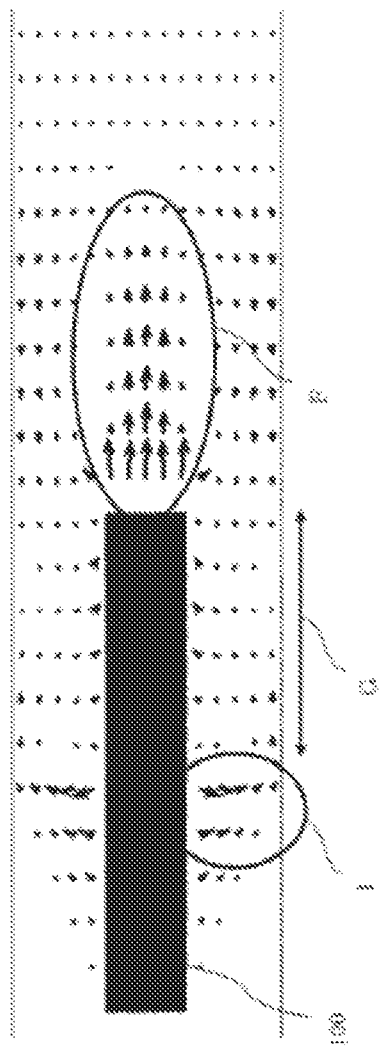

Simulated volumes and directions of airflows generated by the piezoelectric fan 100 of the first embodiment will now be described with reference to FIGS. 4(a), 4(b), 5(a) and 5(b). These figures illustrate simulated volumes and directions of airflows. FIGS. 4(a) and 5(a) illustrate the volume and direction of airflow generated by a conventional piezoelectric fan, whereas FIGS. 4(b) and 5(b) illustrate the volume and direction of airflow generated by the piezoelectric fan 100 of the first embodiment. The conventional piezoelectric fan includes an element equivalent to the first plate 112 of the piezoelectric fan 100 of the first embodiment, but does not include elements equivalent to the second plate 114 and the third plate 116.

FIGS. 4(a) and 4(b) are side views in which the vertical direction of the drawing corresponds to the vibration direction of the piezoelectric fans. The piezoelectric fan 100 of FIG. 4(b) is simplified for convenience of drawing. The circle C in FIG. 4(a) shows a condition of airflow supplied from a free end of the conventional piezoelectric fan. The circle D in FIG. 4(b) shows a condition of airflow supplied from the free end 110a of the piezoelectric fan 100 of the first embodiment. As shown in these drawings, the piezoelectric fan 100 of the first embodiment prevents the lateral airflow and the spread of airflow, and thus improves the directivity of airflow, resulting in a greater volume and velocity of airflow than the conventional piezoelectric fan.

FIGS. 5(a) and 5(b) are top views in which the vertical direction of the drawing is orthogonal to the vibration direction of the piezoelectric fans. The piezoelectric fan 100 of FIG. 5(b) is simplified for convenience of drawing. The ellipse E in FIG. 5(a) shows a condition of airflow supplied from the free end of the conventional piezoelectric fan. The ellipse F in FIG. 5(b) shows a condition of airflow supplied from the free end of the piezoelectric fan 100 of the first embodiment. As shown in these drawings, the piezoelectric fan 100 of the first embodiment prevents the lateral airflow and the spread of airflow, and thus improves the directivity of airflow, resulting in a greater volume and velocity of airflow than the conventional piezoelectric fan.

The arrow G in FIG. 5(b) indicates the range of mounting positions of the second plate 114 and the third plate 116, and the ellipse H in FIG. 5(a) shows the volume and direction of airflow from the positions corresponding to the mounting positions indicated by the arrow G in FIG. 5(b). As shown in these figures, the piezoelectric fan 100 of the first embodiment further effectively prevents the lateral airflow from the longitudinal edges of the piezoelectric fan 100 than the conventional piezoelectric fan. As shown in the ellipse I in FIG. 5(b), also in the piezoelectric fan 100 of the first embodiment, a small amount of air flows laterally in the vicinity of the fixed end compared with in the vicinity of the second plate 114 and the third plate 116. Since the area shown by the ellipse I is close to the fixed end 110b with small vibrations of the piezoelectric fan 100, however, the lateral airflow in the area has only a small effect on the volume and direction of airflow as a whole. Lager mounting positions with a longer second plate 114 and a longer third plate 116 on the first plate 112 help cover the area and prevent the lateral airflow in the area. The range of the mounting positions of the second plate 114 and the third plate 116 on the first plate 112 is optional, and can be determined depending on a structure of the piezoelectric fan 100.

Since the first plate 112, the second plate 114, and the third plate 116 are integrated, the piezoelectric fan 100 of the first embodiment has no clearance between the first plate 112 and the second plate 114 and between the first plate 112 and the third plate 116. The piezoelectric fan 100 of the first embodiment thereby prevents the lateral airflow and the spread of airflow, and thus improves the directivity of airflow and increases the volume and velocity of airflow than the conventional piezoelectric fan.

In contrast, the conventional piezoelectric fan includes an element equivalent to the first plate 112 of the piezoelectric fan 100 of the first embodiment, but does not include elements equivalent to the second plate 114 and the third plate 116. As shown in FIGS. 4(a) and 5(a), a large amount of air flows laterally, resulting in decreases in the volume and velocity of airflow supplied from the free end. Such a conventional piezoelectric fan may be placed between fins of a heat sink. In this case, the fins are positioned on both sides of the piezoelectric fan, and a clearance is provided between the piezoelectric fan and the fin to prevent their contact. Thus lateral airflow passes through the clearances. Even if the conventional piezoelectric fan is placed between the fins of the heat sink, the spread of airflow occurs, resulting in decreases in the volume and velocity of airflow supplied from the free end of the piezoelectric fan.

Figure 6:
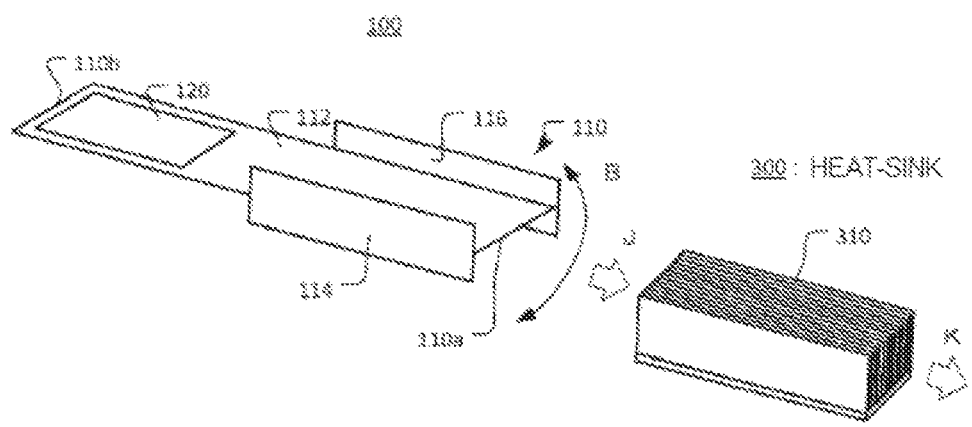
FIG. 6 illustrates a positional relationship between a piezoelectric fan and a heat sink.

As shown in FIG. 6, the piezoelectric fan 100 of the first embodiment can be placed in the rear of a heat sink 300. The heat sink 300 includes a plurality of parallel fins 310 and is used to cool an electronic device. As described above, the voltage fed from the AC power source 130 and applied to the piezoelectric element 120 causes the bending vibration, like a fan, of the piezoelectric fan 100 in the thickness direction of the piezoelectric element 120 (in the direction of the arrow B in FIG. 6). Accordingly, the piezoelectric fan 100 takes air from the side of the fixed end 110b and supplies airflow from the free end 110a as shown by the arrow J in FIG. 6. The supplied airflow passes through the fins 310 of the heat sink 300 placed in the front of the piezoelectric fan 100, as shown by the arrow K in FIG. 6.

The distance between the piezoelectric fan 100 and the heat sink 300 can be adjusted as appropriate. A shorter distance between the piezoelectric fan 100 and the heat sink 300 leads to a greater volume and velocity of airflow passing through the heat sink 300. As a result, the cooling efficiency is improved. Moreover, the piezoelectric fan 100 placed in the rear of the heat sink 300 can eliminate the need to adjust the width of the piezoelectric fan 100 to the interval between adjacent fins 310 of the heat sink 300.

Advantageous Effect of the First Embodiment

As described above, according to the first embodiment, the H-shaped free end 110a of the air blower 110 effectively prevents the lateral airflow and thus improves the directivity of airflow. The piezoelectric fan 100 of the first embodiment can effectively supply airflow to a subject to be cooled.

Second Embodiment

The second embodiment of the present invention will now be described. The second embodiment is a variation of the first embodiment described above. In the following description and the drawings, the same reference numerals are used to denote elements having similar functions to the first embodiment for avoiding redundant description.

Figure 7:
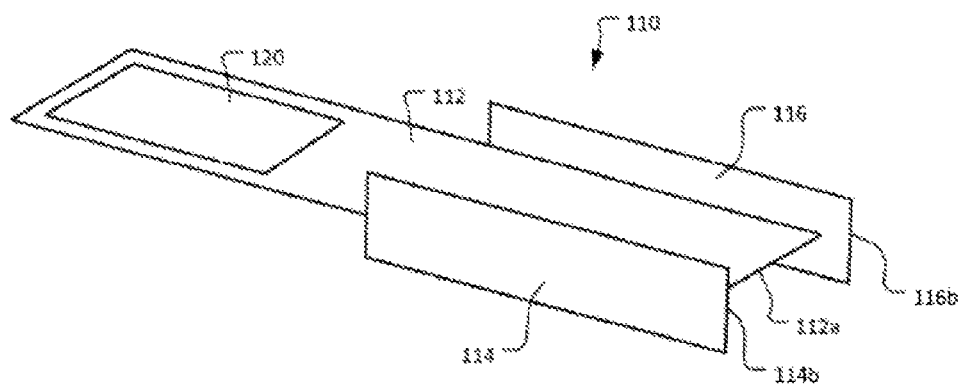
FIG. 7 is a schematic view of the piezoelectric fan according to the second embodiment.

In the first embodiment described with reference to FIG. 1, the ends of the first plate 112, the second plate 114, and the third plate 116 of the piezoelectric fan 100 lie in the same plane at the free end 110a. As shown in FIG. 7, in a piezoelectric fan 200 of the second embodiment, an end 114b of the second plate 114 and an end 116b of the third plate 116 extend beyond an end 112a of the first plate 112. This structure further effectively prevents the spread of airflow supplied from the tip of the first plate 112, and thus improves the directivity of airflow, resulting in increased volume and velocity of airflow.

In the second embodiment, a part of the heat sink 300 can be placed in the space defined by the first plate 112, the second plate 114, and the third plate 116. This enables airflow supplied from the first plate 112 to pass through the heat sink 300 with little spreading.

In the second embodiment, both the end 114b of the second plate 114 and the end 116b of the third plate 116 extend beyond the end 112a of the first plate 112. If other components are placed near the piezoelectric fan 200 for example, their contact should be avoided. In order to prevent their contact, only one of the second plate 114 and the third plate 116 may extend beyond the first plate 112, or the end 114b of the second plate 114 and/or the end 116b of the third plate 116 may lie behind the end 112a of the first plate 112. In this way, the second plate 114 and the third plate 116 can be appropriately positioned relative to the first plate 112.

Third Embodiment

The third embodiment of the present invention will now be described. The third embodiment is a variation of the first embodiment described above. In the following description and the drawings, the same reference numerals are used to denote elements having similar functions to the first embodiment for avoiding redundant description.

Figure 8:
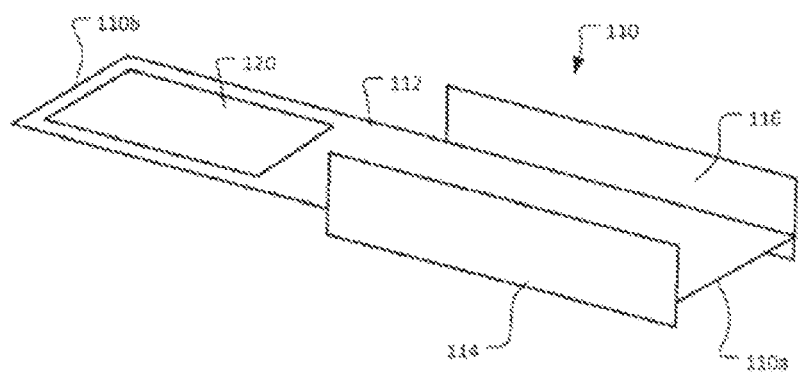
FIG. 8 is a schematic view of the piezoelectric fan according to the third embodiment.

In the first embodiment described with reference to FIG. 1, the second plate 114 and the third plate 116 extend symmetrically in the vertical direction from the longitudinal edges of the first plate 112. As shown in FIG. 8, a piezoelectric fan 300 of the third embodiment includes the second plate 114 and the third plate 116 extending asymmetrically in the vertical direction from the longitudinal edges of the first plate 112. In an embodiment shown in FIG. 8, the second plate 114 and the third plate 116 extend more upwardly than downwardly in relation to first plate 112.

In the structure with these asymmetrical vertical extensions, as described above in connection with the third embodiment, the volume and velocity of airflow supplied from the surface with longer extensions is greater than that from the surface with shorter extensions. Moreover, if other components are placed near the second plate 114 and the third plate 116 in such a structure with asymmetrical vertical extensions, the second plate 114 and the third plate 116 with shorter extensions can keep larger clearances from the components and avoid contact with the components during the bending vibration of the piezoelectric fan 300.

Figure 9:
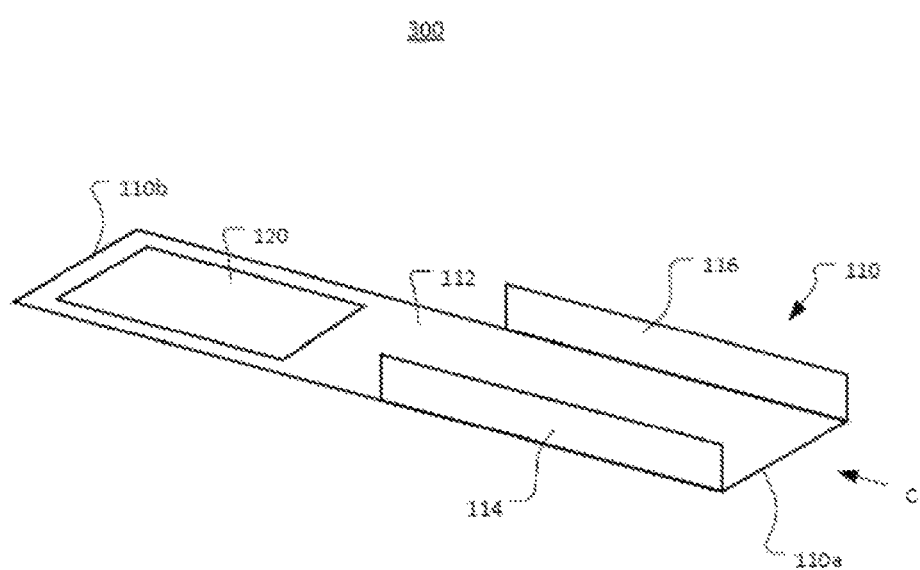
FIG. 9 is a schematic view of the piezoelectric fan according to another example of the third embodiment.

With reference to FIG. 9, in another example of the third embodiment, the second plate 114 and the third plate 116 extend only upward from the longitudinal edges of the first plate 112 without extending downward, which forms a U shape, viewed from the side of the free end 110a. Conversely, the second plate 114 and the third plate 116 may extend only downward from the longitudinal edges of the first plate 112.

Fourth Embodiment

The fourth embodiment of the present invention will now be described. The fourth embodiment is a variation of the first embodiment described above. In the following description and the drawings, the same reference numerals are used to denote elements having similar functions to the first embodiment for avoiding redundant description.

Figure 10:
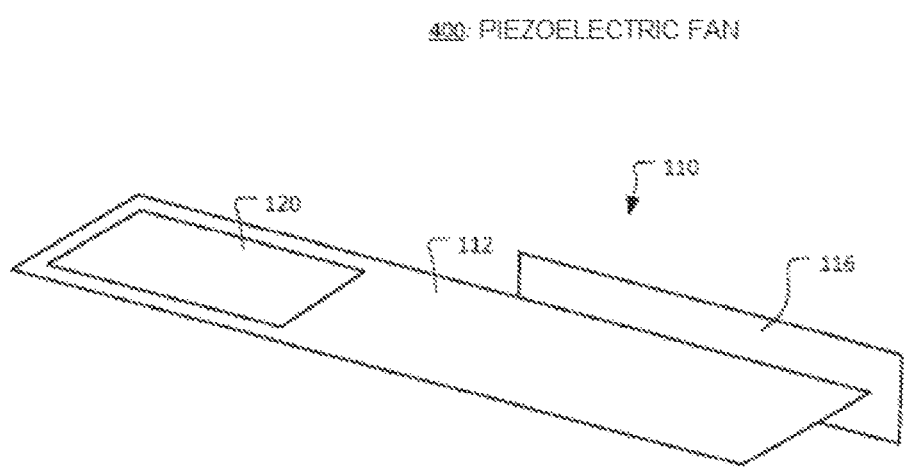
FIG. 10 is a schematic view of the piezoelectric fan according to the fourth embodiment.

In the first embodiment described above, the second plate 114 and the third plate 116 are disposed on the longitudinal edges of the first plate 112. A piezoelectric fan 400 of the fourth embodiment includes only one of the second plate 114 and the third plate 116. FIG. 10 illustrates an embodiment including the third plate 116 only. If other components are placed near the first plate 112, the structure of FIG. 10 prevents the contact of the piezoelectric fan 400 with such other components during the bending vibration of the piezoelectric fan 400.

Fifth Embodiment

The fifth embodiment of the present invention will now be described. The fifth embodiment is a variation of the first embodiment described above. In the following description and the drawings, the same reference numerals are used to denote elements having similar functions to the first embodiment for avoiding redundant description.

Figure 11:
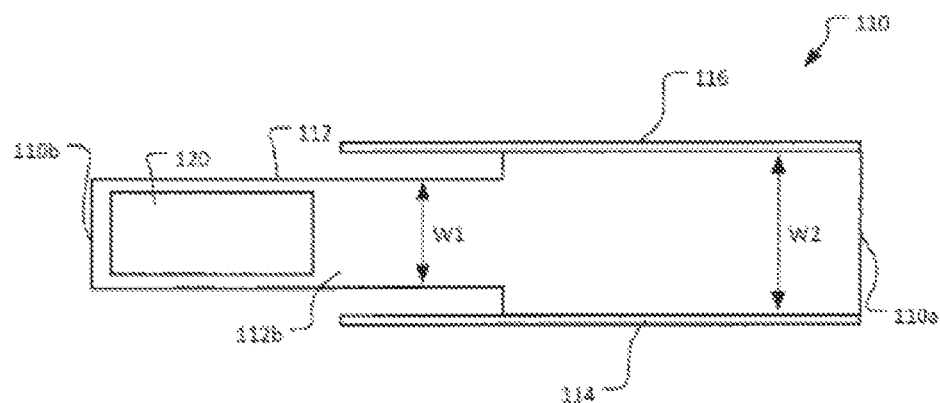
FIG. 11 is a schematic view of the piezoelectric fan according to the fifth embodiment.

In the first embodiment described with reference to FIG. 1, the first plate 112 is rectangular. As shown in FIG. 11, a piezoelectric fan 500 of the fifth embodiment includes a first plate 112 having a narrow part 112b with a width W1 at the fixed end 110b, which is narrower than a width W2 of the free end 110a. A person of ordinary skill in the art would find it routine from the present specification to vary the length of the narrow part 112b.

Figure 12:
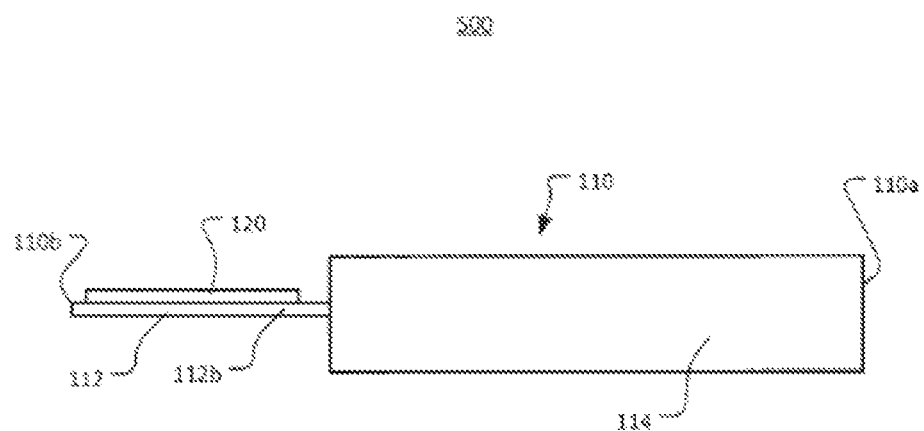
FIG. 12 is a schematic view of the piezoelectric fan according to the fifth embodiment.

Moreover, as shown in FIGS. 11 and 12, in the piezoelectric fan 500 of the fifth embodiment, the second plate 114 and the third plate 116 extend close to the piezoelectric element 120 on the first plate 112. Since the width W1 of the narrow part 112b of the first plate 112, on which the piezoelectric element 120 is provided, is narrower than the width W2 of the free end 110a, the second plate 114 and the third plate 116 can keep clearances from the narrow part 112b, uncoupled from the narrow part 112b.

While a part of the first plate 112 coupled to the second plate 114 and the third plate 116 neither bends nor vibrates, the narrow part 112b uncoupled from the second plate 114 and the third plate 116 bends and vibrates. In the piezoelectric fan 500 of the fifth embodiment, the second plate 114 and the third plate 116 extending close to the piezoelectric element 120 on the first plate 112 prevent the lateral airflow in the vicinity of the piezoelectric element 120 and the spread of airflow, and thus improve the directivity of airflow and increases the volume and velocity of airflow.

Sixth Embodiment

The sixth embodiment of the present invention will now be described. The sixth embodiment is a variation of the first embodiment described above. In the following description and the drawings, the same reference numerals are used to denote elements having similar functions to the first embodiment for avoiding redundant description.

Figure 13:
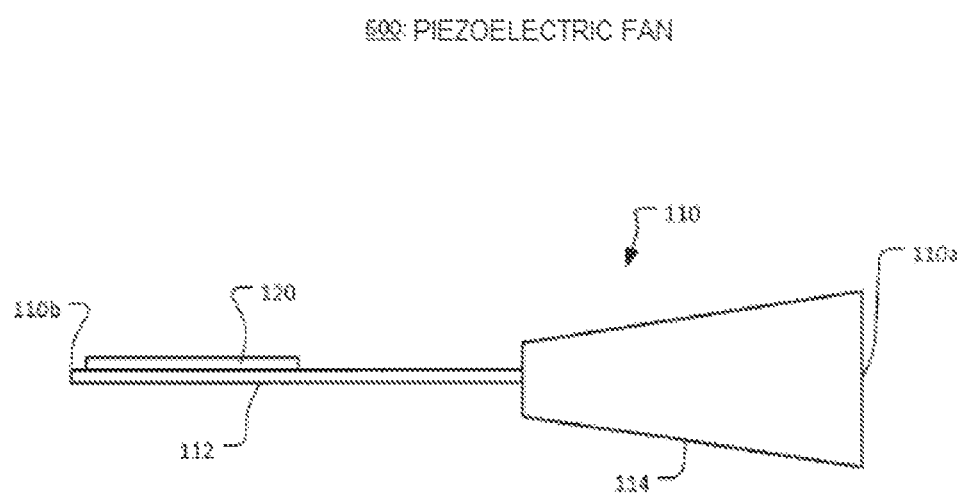
FIG. 13 is a schematic view of the piezoelectric fan according to the sixth embodiment.

In the first embodiment described with reference to FIG. 1, the second plate 114 and the third plate 116 are rectangular. As shown in FIG. 13, in a piezoelectric fan 600 of the sixth embodiment, the second plate 114 and the third plate 116 each have a trapezoidal shape with an increasing width toward the free end 110a.

The piezoelectric fan 600 including the air blower 110 described above improves the directivity of airflow and increases the volume and velocity of airflow in the same way as the first embodiment described above.

Seventh Embodiment

The seventh embodiment of the present invention will now be described. The seventh embodiment is a variation of the first embodiment described above. In the following description and the drawings, the same reference numerals are used to denote elements having similar functions to the first embodiment for avoiding redundant description.

Figure 14:
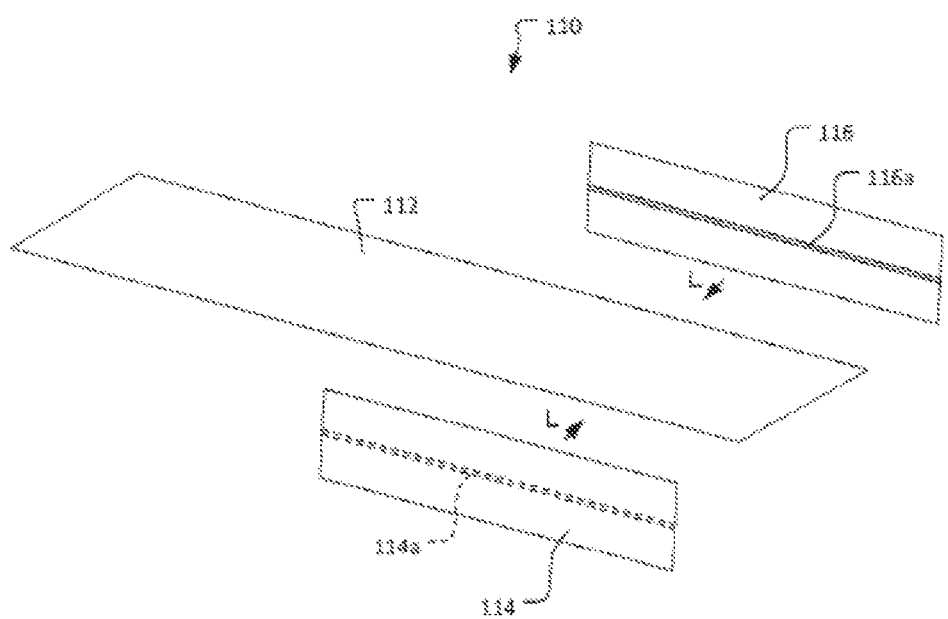
FIG. 14 is a schematic view of the piezoelectric fan according to the seventh embodiment.

In the first embodiment described with reference to FIG. 2, the first plate 112, the second plate 114, and the third plate 116 of the air blower 110 are integrated. In a piezoelectric fan 700 of the seventh embodiment described with reference to FIG. 14, the first plate 112, the second plate 114, and the third plate 116 of the air blower 110 are composed of different parts. FIG. 14 illustrates an embodiment in which fitting grooves 114a and 116a are formed longitudinally in the lateral middle of the second plate 114 and the third plate 116 respectively. As shown by the arrow L in FIG. 14, the fitting grooves 114a and 116a accept the longitudinal edges of the first plate 112 for engagement. The air blower 110 thereby forms an H shape, viewed from the side of the free end 110a in the same way as shown in FIG. 2.

The engagement structure can be made in the opposite way to the way shown in FIG. 14. That is, the first plate 112 may have fitting grooves, and the second plate 114 and the third plate 116 may have projections so that the fitting grooves in the first plate 112 accept the projections of the second plate 114 and the third plate 116 for engagement. The projections and grooves may have various shapes and structures for ease of manufacturing and mounting without misalignment.

The piezoelectric fan 700 including the air blower 110 described above improves the directivity of airflow and increases the volume and velocity of airflow in the same way as the first embodiment described above.

The first plate 112, the second plate 114, and the third plate 116 of the air blower 110 composed of different parts, as shown in FIG. 14, may be made of different materials.

In detail, the first plate 112, which functions as a fan, may be made of a material with a higher bending strength than that of the second plate 114 and the third plate 116. The use of such a material enhances the strength of the piezoelectric fan 700 and prolongs its life.

The second plate 114 and the third plate 116, which determine the direction of airflow, may be made of a material with a lower specific gravity than that of the first plate 112. The use of such a material reduces the total weight of the piezoelectric fan, enhances the strength of the piezoelectric fan 700, and prolongs its life.

By contrast with the embodiments illustrated in FIGS. 2 and 14, the first plate 112, and the second plate 114 or the third plate 116 may be integrated, and the third plate 116 or the second plate 114 may be composed of a different part. That is, the first plate 112 and the second plate 114 may be integrated, and the third plate 116 may be composed of a different part, or the first plate 112 and the third plate 116 may be integrated, and the second plate 114 may be composed of a different part.

Also in the piezoelectric fan 200 of the second embodiment, the piezoelectric fan 300 of the third embodiment, the piezoelectric fan 400 of the fourth embodiment, the piezoelectric fan 500 of the fifth embodiment, and the piezoelectric fan 600 of the sixth embodiment, the first plate 112, the second plate 114, and the third plate 116 may be composed of different members, be made of different materials, or have different strengths in the same way as in the seventh embodiment.

Although preferred embodiments of the present invention have been described so far with reference to the accompanying drawings, it is obvious that the present invention should not be limited to these embodiments. It will be understood by those skilled in the art that variations and modifications may be made within the scope of the claims, and those variations and modifications will be within the technical scope of the present invention as a matter of course.

For example, in the above embodiments, the second plate 114 and the third plate 116 are orthogonal to the first plate 112 and parallel to each other; however, the present invention should not be limited to this embodiment. The angles of the second plate 114 and the third plate 116 relative to the first plate 112, and the angle of the second plate 114 relative to the third plate 116 can be appropriately varied depending on a positional relationship between the piezoelectric fan 100 and a subject to be cooled, or a layout of other adjacent components in order to appropriately modify the direction and volume of airflow to generate.

All of the above second to seventh embodiments are variations of the first embodiment. It should be noted that the piezoelectric fan of the present invention may be an optional combination of one or more of these variations.

The following is a list of reference numerals and associated parts as used in this specification and drawings:

| Reference Numeral | Part |
| --- | --- |
| 100 | Piezoelectric Fan |
| 110 | Air Blower |
| 110a | Free End |
| 110b | Fixed End |
| 112 | First Plate |
| 112a | An end of the first plate 112 |
| 112b | Narrow part |
| 114 | Second Plate |
| 114a | Fitting Groove |
| 114b | An end of the second plate 114 |
| 116 | Third Plate |
| 116a | Fitting Groove |
| 116b | An end of the third plate 116 |
| 120 | Piezoelectric Element |
| 130 | AC Power Source |
| 200 | Piezoelectric fan |
| 300 | Heat sink |
| 310 | Fins |
| 400 | Piezoelectric fan |
| 500 | Piezoelectric fan |
| 600 | Piezoelectric fan |
| 700 | Piezoelectric fan |

The scope of the claims should not be limited by the preferred embodiments and examples described herein, but should be given the broadest interpretation consistent with the written description as a whole.

The invention claimed is:

1. A piezoelectric fan comprising:
an air blower having only one free end and a fixed end; and
a planar piezoelectric element fixed to the air blower, the piezoelectric element being configured to cause vibration of the free end of the air blower,
the air blower comprising:
a vibration plate to which the piezoelectric element is fixed; and
a first side plate disposed on one longitudinal edge of the vibration plate and a second side plate disposed on an opposite longitudinal edge of the vibration plate;
wherein the first side plate and the second side plate extend above and below the vibration plate in a vertical direction from the longitudinal edges of the vibration plate; and
wherein the first and second side plates are each affixed to the vibration plate along their respective longitudinal edges in such a manner as to cause the first and second side plates to vibrate in harmony with the vibration plate;

wherein a cross-section of the free end of the air blower, taken along a longitudinal axis of the vibration plate, has an H-shape with the vibration plate being the only vibration plate situated between the first and second side plates of the H-shape; and wherein the piezoelectric element is separated from the first and second side plates along the longitudinal axis of the vibration plate.

2. A piezoelectric fan comprising:

an air blower having only one free end and a fixed end; and a planar piezoelectric element fixed to the air blower, the piezoelectric element being configured to cause vibration of the free end of the air blower, the air blower comprising:

a vibration plate to which the piezoelectric element is fixed; and a first side plate disposed on one longitudinal edge of the vibration plate and a second side plate disposed on an opposite longitudinal edge of the vibration plate; wherein the first side plate and the second side plate extend above and below the vibration plate in a vertical direction from the longitudinal edges of the vibration plate;

and wherein the first and second side plates are each affixed to the vibration plate along their respective longitudinal edges in such a manner as to cause the first and second side plates to vibrate in harmony with the vibration plate;

wherein a cross-section of the free end of the air blower, taken along a longitudinal axis of the vibration plate, has an H-shape with the vibration plate being the only vibration plate situated between the first and second side plates of the H-shape;

wherein the first side plate and the second side plate extend beyond the end of the vibration plate at the free end; and wherein the piezoelectric element is separated from the first and second side plates along the longitudinal axis of the vibration plate.

3. A piezoelectric fan comprising:

an air blower having only one free end and a fixed end; and a planar piezoelectric element fixed to the air blower, the piezoelectric element being configured to cause vibration of the free end of the air blower, the air blower comprising:

a vibration plate to which the piezoelectric element is fixed; and a first side plate disposed on one longitudinal edge of the vibration plate and a second side plate disposed on an opposite longitudinal edge of the vibration plate; wherein the first side plate and the second side plate extend above and below the vibration plate in a vertical direction from the longitudinal edges of the vibration plate; and wherein the first and second side plates are each affixed to the vibration plate along their respective longitudinal edges in such a manner as to cause the first and second side plates to vibrate in harmony with the vibration plate;

wherein a cross-section of the free end of the air blower 1 taken along a longitudinal axis of the vibration plate, has an H-shape with the vibration plate being the only vibration plate situated between the first and second side plates of the H-shape;

wherein the vibration plate and the first side plate and the second side plate comprise different parts; and wherein the piezoelectric element is separated from the first and second side plates along the longitudinal axis of the vibration plate.

4. The piezoelectric fan according to claim 3, wherein the vibration plate and the first side plate and the second side plate comprise different materials.

5. The piezoelectric fan according to claim 4, wherein the vibration plate comprises a material with a higher bending strength than that of the first side plate and the second side plate.

6. The piezoelectric fan according to claim 4, wherein the first side plate and the second side plate comprise a material with a lower specific gravity than that of the vibration plate.

* * * * *